(12) United States Patent
Shin et al.

(10) Patent No.: US 11,038,152 B2
(45) Date of Patent: Jun. 15, 2021

(54) ORGANIC LIGHT-EMISSION DEVICE

(71) Applicants: LG DISPLAY CO., LTD., Seoul (KR); INDUSTRY-UNIVERSITY COOPERATION FOUNDATION HANYANG UNIVERSITY, Seoul (KR)

(72) Inventors: Jicheol Shin, Seoul (KR); Jeongdae Seo, Incheon (KR); Jae-Hoon Kim, Seoul (KR); Chang-Jae Yu, Seoul (KR)

(73) Assignees: LG DISPLAY CO., LTD., Seoul (KR); INDUSTRY-UNIVERSITY COOPERATION FOUNDATION HANYANG UNIVERSITY, Seoul (KR)

( * ) Notice: Subject to any disclaimer, the term of this patent is extended or adjusted under 35 U.S.C. 154(b) by 0 days.

(21) Appl. No.: 16/689,962

(22) Filed: Nov. 20, 2019

(65) Prior Publication Data

US 2020/0161592 A1  May 21, 2020

(30) Foreign Application Priority Data

Nov. 20, 2018 (KR) .................. 10-2018-0143771

(51) Int. Cl.
  *H01L 51/52* (2006.01)
  *H01L 51/50* (2006.01)
  (Continued)

(52) U.S. Cl.
  CPC ...... *H01L 51/5293* (2013.01); *H01L 51/0003* (2013.01); *H01L 51/0012* (2013.01);
  (Continued)

(58) Field of Classification Search
  None
  See application file for complete search history.

(56) References Cited

FOREIGN PATENT DOCUMENTS

| JP | 4316832 B2 | 8/2009 |
|----|------------|--------|
| JP | 2012-74221 A | 4/2012 |

OTHER PUBLICATIONS

Lee et al., Control of Circularly Polarized Electroluminescence in Induced Twist Structure of Conjugate Polymer, 2017, Adv. Mater. 29, 1700907 (Year: 2017).*

* cited by examiner

*Primary Examiner* — Xiaoming Liu
(74) *Attorney, Agent, or Firm* — Birch, Stewart, Kolasch & Birch, LLP

(57) ABSTRACT

Disclosed is an organic light-emission device including a first electrode, a second electrode, and the light-emission layer interposed therebetween, wherein the light-emission layer contains a mesogenic polymer-based light-emission material and a chiral dopant, wherein the light-emission layer has one face facing the first electrode and an opposite face facing the second electrode, wherein molecules of the mesogenic polymer-based light-emission material in the one face are orientated in a first predetermined direction, while molecules of the mesogenic polymer-based light-emission material in the opposite face are orientated in a second predetermined direction different from the first predetermined direction, wherein an angle of the second predetermined direction relative to the first predetermined direction is defined as a twisted angle, and wherein molecules of the mesogenic polymer-based light-emission material are vertically arranged in a spirally twisted manner within the twisted angle between the one and opposite faces of the light-emission layer to form a twisted structure.

12 Claims, 13 Drawing Sheets

(51) Int. Cl.
*H01L 51/56* (2006.01)
*H01L 51/00* (2006.01)

(52) U.S. Cl.
CPC ...... *H01L 51/0028* (2013.01); *H01L 51/5012* (2013.01); *H01L 51/5056* (2013.01); *H01L 51/5072* (2013.01); *H01L 51/5281* (2013.01); *H01L 51/56* (2013.01); *H01L 51/004* (2013.01); *H01L 51/0035* (2013.01); *H01L 51/0036* (2013.01); *H01L 51/0039* (2013.01); *H01L 51/0043* (2013.01); *H01L 51/0073* (2013.01); *H01L 51/0078* (2013.01)

100

ORGANIC LIGHT-EMISSION DEVICE

CROSS-REFERENCE TO RELATED APPLICATIONS

This application claims the priority of Korean Patent Application No. 10-2018-0143771 filed on Nov. 20, 2018, in the Korean Intellectual Property Office, the disclosure of which is hereby incorporated by reference in its entirety into the present application.

BACKGROUND

1. Technical Field

The present disclosure relates to an organic light-emission device.

2. Description of the Related Art

As a size of a display device has been increased, there has been a growing interest in a flat display device with a small occupancy or footprint. A technique of an organic light-emission display device including an organic light-emission device or an organic light-emission diode (OLED) as one of such flat display devices has been rapidly developed.

In the organic light-emitting diode (OLED), when charges are injected into a light-emission layer formed between an anode and a cathode, paired electrons and holes form excitons. Then, light emission can occur when the exciton falls to a ground state. The organic light emitting diode is driven at a lower voltage than that of a conventional display device, has relatively low power consumption, and has excellent color rendering and is applicable to a flexible substrate for various applications.

SUMMARY

A purpose of the present disclosure is to provide an organic light-emission device with excellent light-transmittance and light efficiency while applying a circular polarizer to the device.

Another purpose of the present disclosure is to provide a method for manufacturing an organic light-emission device having excellent light-transmittance and light efficiency while applying a circular polarizer to the device.

The purposes of the present disclosure are not limited to the above-mentioned purposes. Other purposes and advantages of the present disclosure, than those mentioned above, can be understood from the following descriptions and more clearly understood from the embodiments of the present disclosure. Further, it will be readily appreciated that the purposes and advantages of the present disclosure can be realized by features and combinations thereof as disclosed in the claims.

In one aspect of the present disclosure, there is proposed an organic light-emission device comprising: a first electrode, a second electrode, and the light-emission layer interposed therebetween, wherein the light-emission layer contains a mesogenic polymer-based light-emission material and a chiral dopant, wherein the light-emission layer has one face facing the first electrode and an opposite face facing the second electrode, wherein molecules of the mesogenic polymer-based light-emission material in the one face are orientated in a first predetermined direction, while molecules of the mesogenic polymer-based light-emission material in the opposite face are orientated in a second predetermined direction different from the first predetermined direction, wherein an angle of the second predetermined direction relative to the first predetermined direction is defined as a twisted angle, wherein molecules of the mesogenic polymer-based light-emission material are vertically arranged in a spirally twisted manner within the twisted angle between the one and opposite faces of the light-emission layer to form a twisted structure, wherein the twisted angle of the light-emission layer is greater than a saturated twisted angle of the mesogenic polymer-based light-emission material.

In another aspect of the present disclosure, there is proposed an organic light-emission device comprising: a first electrode, a second electrode, and the light-emission layer interposed therebetween, wherein the light-emission layer contains a mesogenic polymer-based light-emission material and a chiral dopant, wherein the light-emission layer has one face facing the first electrode and an opposite face facing the second electrode, wherein molecules of the mesogenic polymer-based light-emission material in the one face are orientated in a first predetermined direction, while molecules of the mesogenic polymer-based light-emission material in the opposite face are orientated in a second predetermined direction different from the first predetermined direction, wherein molecules of the mesogenic polymer-based light-emission material are vertically arranged in a twisted manner based on a difference between the first and second predetermined directions, thereby to form a twisted structure, wherein an angle of the second predetermined direction relative to the first predetermined direction is defined as a twisted angle, wherein the twisted angle is in a range of 60° to 100°.

In still another aspect of the present disclosure, there is proposed a method for manufacturing an organic light-emission device, the method comprising: providing a first electrode; forming a hole transport layer on the first electrode; applying orientation into a top face of the hole transport layer to form an orientation-formed film of the hole transport layer; applying and drying a solution on the orientation-formed film to form a provisional light-emission layer on the hole transport layer, wherein the solution contains a mesogenic polymer-based light-emission material and a chiral dopant; applying orientation into a top face of the provisional light-emission layer to have an orientation different from the orientation of the orientation-formed film of the hole transport layer; coating a photocurable polymer on the oriented top face of the provisional light-emission layer to form a coated layer and then photo-curing the coated layer; heating the provisional light-emission layer to form a light-emission layer having a twisted structure; removing the coated layer; and forming a second electrode over the light-emission layer.

The organic light-emission device according to the present disclosure includes a light-emission layer having circularly polarized light-emission in which one of the right-handed circular polarization and left-handed circular polarization is more dominant than the other thereof. Further, the circular polarization direction of light emitted from the light-emission layer and the circular polarization direction of the circular polarizer can be the same. This can improve the light-transmittance and thus improve light efficiency of the device.

The method for manufacturing the organic light-emission device according to the present disclosure can achieve the organic light-emission device including the light-emission layer having circularly polarized light-emission in which one of the right-handed circular polarization and left-handed circular polarization is more dominant than the other thereof.

In addition to the above effects, specific effects of the present disclosure are described below in conjunction with descriptions of specific details to implement the present disclosure.

DETAILED DESCRIPTIONS OF THE EMBODIMENTS

Figure 1:
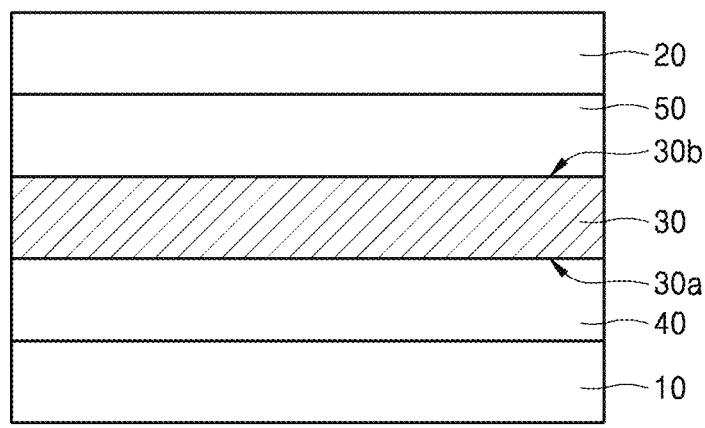
FIG. 1 is a schematic cross-sectional view of an organic light-emission device according to an example embodiment of the present disclosure.

For simplicity and clarity of illustration, elements in the figures are not necessarily drawn to scale. The same reference numbers in different figures denote the same or similar elements, and as such perform similar functionality. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

Examples of various embodiments are illustrated and described further below. It will be understood that the description herein is not intended to limit the claims to the specific embodiments described. On the contrary, it is intended to cover alternatives, modifications, and equivalents as can be included within the spirit and scope of the present disclosure as defined by the appended claims.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and need not modify the individual elements of the list.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, organic light-emission devices according to some embodiments of the present disclosure will be described.

In one implementation of the present disclosure, there is proposed an organic light-emission device comprising: a first electrode, a second electrode, and the light-emission layer interposed therebetween, wherein the light-emission layer contains a mesogenic polymer-based light-emission material and a chiral dopant, wherein the light-emission layer has one face facing the first electrode and an opposite face facing the second electrode, wherein molecules of the mesogenic polymer-based light-emission material in the one face are orientated in a first predetermined direction, while molecules of the mesogenic polymer-based light-emission material in the opposite face are orientated in a second predetermined direction different from the first predetermined direction, wherein an angle of the second predetermined direction relative to the first predetermined direction is defined as a twisted angle, wherein molecules of the mesogenic polymer-based light-emission material are vertically arranged in a spirally twisted manner within the twisted angle between the one and opposite faces of the light-emission layer to form a twisted structure, wherein the twisted angle of the light-emission layer is greater than a saturated twisted angle of the mesogenic polymer-based light-emission material.

In one embodiment, the twisted angle can be in a range of 60° to 100°.

FIG. 1 is a schematic cross-sectional view of an organic light-emission device according to an example embodiment of the present disclosure.

As shown in FIG. 1, an organic light-emission device 100 according to an embodiment of the present disclosure includes a first electrode 10, a light-emission layer 30 and a second electrode 20. All components of organic light-emission device 100 according to all embodiments of the present disclosure are operatively coupled and configured.

The light-emission layer 30 includes one face 30a facing the first electrode 10 and an opposite face 30b facing the second electrode 20. Molecules in the one face 30a are orientated in a first predetermined direction. Molecules in the opposite face 30b are orientated in a second predetermined direction different from the first predetermined direction. In embodiments, molecules of the mesogenic polymer-based light-emission material between the one face 30a and the opposite face 30b can be orientated in a third direction different from the first and second predetermined directions, and the third direction can be different from the first and second predetermined directions, and can intersect both the first and second predetermined directions.

The light-emission layer 30 includes a mesogenic polymer-based light-emission material and a chiral dopant. Due to a difference between the orientation of the molecules of one face 30a and the orientation of the molecules of the opposite face 30b, molecules of the mesogenic polymer-based light-emission material are spirally stacked to form a twisted structure or spiral stack.

Figure 2:
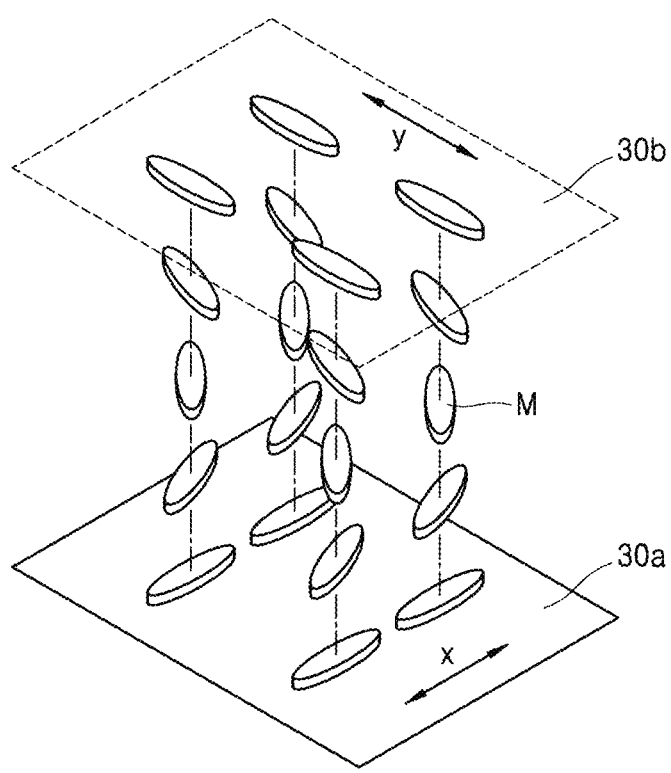
FIG. 2 is a schematic representation of a twisted structure formed by a mesogenic polymer-based light-emission material in a light-emission layer of an organic light-emitting device according to an example embodiment of the present disclosure.

FIG. 2 is a schematic representation of a twisted structure of the mesogenic polymer-based light-emission material in the light-emission layer 30. The molecule M of the mesogenic polymer-based light-emission material can be elongate, as shown in FIG. 2. When a thickness direction of the light-emission layer 30 is defined as a z direction, directions of x-y vectors of longitudinal directions of the molecules M of the mesogenic polymer-based light-emission material on the opposed both faces of the light-emission layer 30 are different from each other.

In FIG. 2, a direction of the x-y based vector of a longitudinal direction of the molecular M of the mesogenic polymer-based light-emission material in the one face 30a is denoted as a X direction, while a direction of the x-y based vector of a longitudinal direction of the molecular M of the mesogenic polymer-based light-emission material in the opposite face 30b is denoted as a Y direction. The twisted structure is formed by stacking the molecules M of the mesogenic polymer-based light-emission material in a direction of thickness (Z direction) in the spiral and twisted manner due to the difference between the directions X and Y of the x-y based vectors of longitudinal directions of the molecules M of the mesogenic polymer-based light-emission material in the one and opposite faces 30a and 30b.

The twisted angle can be defined as an angle of the Y direction relative to the X direction.

The light-emission layer 30 has the twisted structure to generate and emit light having circular polarization characteristics. Depending on the structural characteristics of the twisted structure, either right-handed circular polarization or left-handed circular polarization can be dominated in the light emitted from the light-emitting layer 30. Depending on the direction of the twisted angle, either right-handed circular polarization or left-handed circular polarization can be selected.

As used herein, circular polarization is a concept including a circular polarization or an elliptical polarization. The circular polarization can refer to a case when a vector sum of a x-axis magnetic field and a y-axis magnetic field in an incident plane of light traveling in a z-axis direction changes circularly, that is, refer to a case when amplitudes of the x-axis magnetic field and the y-axis magnetic field are exactly the same and a phase difference therebetween is 90°. Further, the elliptical polarization means all polarizations other than a linear polarization and a circular polarization. That is, when a combined magnetic field vector rotates and a magnitude thereof changes, a polarized state follows an ellipse. This can be defined as an elliptical polarization. Further, from a viewpoint of an observer facing in an exactly perpendicularly to a traveling direction of the light, a case when the combined magnetic field vector rotates in a clockwise direction is referred to as a right-handed circular polarization, while a case when the combined magnetic field vector rotates in a counterclockwise direction is referred to as a left-handed circular polarization.

When the circular polarizer is applied as an anti-reflective film to the organic light-emitting device, and when light emitted from the light-emission layer has a circular polarization direction opposite to a circular polarization direction of the circular polarizer, the light will not pass through the anti-reflective film, resulting in deterioration of an optical transmittance.

In the organic light-emitting device 100, when light emitted from the light-emission layer 30 has an inbalance between the right-handed circular polarization and left-handed circular polarization, and a circular polarization direction of dominant one between the right-handed circular polarization and left-handed circular polarization is equal to a circular polarization direction of the circular polarizer, the light emitted from the light-emission layer 30 can pass predominantly through the anti-reflective film. As a result, the organic light-emitting device 100 exhibits high light transmittance and can exhibit excellent light efficiency characteristics.

The light transmittance of the organic light-emitting device 100 is related to a g-factor when the circular polarizer as the anti-reflective film of is applied thereto. The g-factor is calculated by a following Relationship 1 and indicates a predominance of the dominant one between the right-handed circular polarization and left-handed circular polarization.

$$g\text{-factor}=2*(IL-IR)/(IL+IR) \qquad \text{[Relationship 1]}$$

where IL refers to an intensity of light having left-handed circular polarization characteristics; IR refers to an intensity of light having right-handed circular polarization characteristics.

When the g-factor is 0, the right-handed circular polarization and left-handed circular polarization can be balanced out. When an absolute value of the g-factor increases, either the right-handed circular polarization or the left-handed circular polarization is dominant. The g-factor is usually a value calculated using an EL spectrum. However, the g-factor can be a value calculated using a PL spectrum.

As used herein, gPL denotes a g-factor measured using the PL spectrum, while gEL denotes a g-factor measured using the EL spectrum.

The light-emission layer 30 of the organic light-emitting device 100 has a twisted structure with a large twisted angle as described above such that a high g-factor is achieved in which either the right-handed circular polarization or the left-handed circular polarization is highly dominant.

In order to maximize the g-factor, the difference between the molecule orientation X of one face 30a of the light-emission layer and the molecule orientation Y of the opposite face 30b thereof, that is, the twisted angle θT should be large.

In order to allow one face 30a of the light-emission layer to have the molecule orientation, a contact layer thereto (hole transport layer 40 in FIG. 1) is formed as an orientation-formed film. Then, the light-emission layer is formed on a top of the orientation-formed film via a solution process. The orientation-formed film can have an orientation thereon by applying a surface azimuthal anchoring energy onto a surface thereof via rubbing or optical orientation. One face 30a of the light-emission layer contacting the orientation-formed film can be formed to have the same orientation as that of the orientation-formed film. The opposite face 30b of the light-emission layer can be formed to have an orientation such that the orientation thereof and the orientation of the orientation-formed film are different from each other. Thus, the light-emission layer has the twisted structure therein. The opposite face 30b of the light-emission layer can have the orientation by applying the surface azimuthal anchoring energy onto the surface thereof via rubbing or optical orientation to orient the molecules of the mesogenic polymer-based light-emission material in one direction.

After allowing the opposite face 30b of the light-emission layer to have the orientation, the orientation thereof can be fixed by an additional process as described below. Then, when a twisted structure of the light-emission layer is formed by heat treatment, the twisted angle θT of the twisted structure of the light-emission layer can increase in a proportional manner to the difference between the orientation of the orientation-formed film and the orientation of the opposite face 30b of the light-emission layer 30.

However, when the mesogenic polymer-based light-emission material alone forms the light-emission layer, and when the difference between the orientation of the orientation-formed film and the orientation of the opposite face 30b of the light-emission layer increases up to a certain angle, the twisted angle θT of the twisted structure of the light-emission layer no longer increases above the certain angle and that is saturated. This certain angle is called a saturated twisted angle θS of the mesogenic polymer-based light-emission material. The saturated twisted angle θS is determined by types of light-emission materials with different elastic moduli. Thus, the saturated twisted angle θS is the maximum twisted angle that a certain mesogenic polymer-based light-emission material can achieve in the light-emission layer.

The twisted structure of the light-emission layer 30 can be achieved while maintaining the difference between the orientation of the orientation-formed film defining the orientation of one face 30a and the orientation of the opposite face 30b, in particular, while fixing the orientation of the opposite face 30b by a manufacturing method as described later. Thus, the twisted angle θT of the twisted structure can be formed to be larger than the saturated twisted angle θS. This will be described in detail in the manufacturing method as described later.

Further, since the light-emission layer 30 further contains the chiral dopant in addition to the mesogenic polymer-based light-emission material, the chiral dopant can allow the twisted angle θT to be larger than the saturated twisted angle θS of the mesogenic polymer-based light-emission material alone.

That is, the light-emission layer 30 uses the chiral dopant in addition to the mesogenic polymer-based light-emission material. Further, the difference between the orientation of the orientation-formed film and the orientation of the opposite face 30b of the light-emission layer 30 is made larger than the saturated twisted angle θS of the mesogenic polymer-based light-emission material. Moreover, the twisted structure of the light-emission layer 30 is achieved while fixing the orientation of the opposite face 30b by a manufacturing method as described later. Eventually, the light-emission layer 30 can achieve a larger twisted angle θT.

A reason why the saturated twisted angle θS occurs is because an elastic modulus K2 of the mesogenic polymer-based light-emission material influencing the twisted structure is as high as about 10-11 to 10-10 N. Generally, the elastic modulus of the polymer is high.

Thus, the light-emission layer 30 can achieve the larger g-factor value by achieving the larger twisted angle θT.

Specifically, the twisted angle θT of the light-emission layer 30, that is, the angle between the orientation of one face 30a and the orientation of the opposite face 30b can be in a range of 60° to 100°.

The twisted angle θT of the light-emission layer 30 can be maintained to be in the above defined range by adjusting the orientation of the orientation-formed film and the orientation of the opposite face 30b of the light-emission layer 30, and adjusting the elastic modulus K2 of the mesogenic polymer-based light-emission material, the surface azimuthal fixed energy, and a thickness of the light-emission layer.

In one embodiment of the present disclosure, the organic light-emitting device 100 can have an absolute value of the g-factor of light emitted from the light-emission layer 30 in a range of from 0.01 to 2. Specifically, an absolute value of the g-factor can be in a range of 0.4 to 2. Thus, one of the right-handed circular polarization and the left-handed circular polarization can be predominant.

Figure 12:
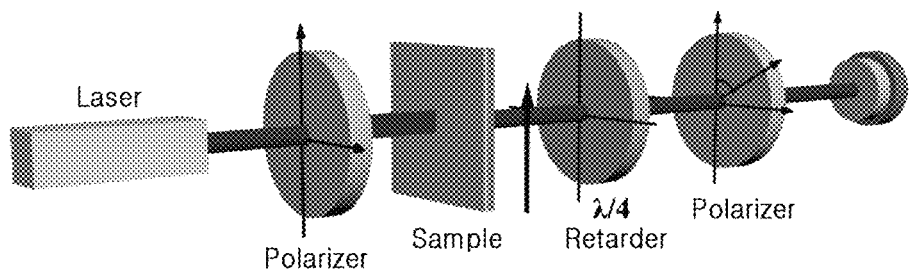
FIG. 12 is a schematic representation of an experimental setup to measure a twisted angle of a light-emission layer of an organic light-emission device according to one implementation of the present disclosure.

In accordance with the present disclosure, in order to measure the twisted angle of the light-emission layer 30, we compared a Stokes variance measured after passing light linearly polarized in the rubbing direction through the light-emission layer of a twisted structure with a Stokes variance calculated by a Mueller matrix using a twist angle. Then, the comparison was evaluated. An experimental set-up for the measurement is shown schematically in FIG. 12. In FIG. 12, a light-emission layer sample whose twisted angle is to be measured was placed at a sample location. Light from a laser was selected to have a wavelength of light that is not absorbed by the light-emission layer. A detailed description of measuring and calculating the twisted angle is disclosed in an article "Control of Circularly Polarized Electroluminescence in Induced Twist Structure of Conjugate Polymer, Jae-Hoon Kim, et al., Adv. Mater. 2017, 29, p1700907".

In one example, the mesogenic polymer-based light-emission material can include at least one selected from a group consisting of poly(9,9-dioctylfluorene-cobenzothiadiazole) (F8BT), and poly(9,9-dioctyl-2,7-fluorene) (PFO). However, the present disclosure is not limited thereto. The mesogenic polymer-based light-emission material can include a polymer with mesogenic characteristics and light-emission characteristics.

The light-emission layer 30 achieves the twisted angle θT exceeding the saturated twisted angle θS of the mesogenic polymer-based light-emission material by containing the chiral dopant therein. Thus, in light emitted from the light-emission layer 30, the right-handed circular polarization or the left-handed circular polarization dominates. The chiral dopant can affect the orientation of molecules in the mesogenic polymer-based light-emission material surrounding the dopant.

The light-emission layer 30 can contain the chiral dopant in a content range from 0.1 to 30 wt %. When the light-emission layer 30 contain the chiral dopant in the above defined range, the chiral dopant can work effectively so that the twisted angle θT of the light-emitting layer 30 is larger than the saturated twisted angle θS of the mesogenic polymer-based light-emission material.

The first electrode 10 acts as an anode and feeds a hole into the light-emission layer. The first electrode can contain a conductive material with a high work function to facilitate the feeding of the hole. The first electrode 10 can be made of a conductive material, for example, indium-tin-oxide (ITO), indium-zinc-oxide (IZO) or zinc-oxide (ZnO).

The second electrode 20 acts as a cathode for injecting electrons and can be made of a conductive material having a small work function, for example, aluminum (Al), magnesium (Mg), or aluminum-magnesium alloy (AlMg).

The orientation-formed film can be embodied as the hole transport layer 40. The hole transport layer 40 has an interface with the light-emission layer 30. The interface has the orientation based on rubbing or optical orientation.

The hole transport layer (HTL) 40 contains a hole transport material which can be oriented. The hole transport layer 40 is formed into the orientation-formed film. Then, the mesogenic polymer-based light-emission material is applied on top of the orientation-formed film via, for example, a solution process. Thus, molecules in the one face 30a of the light-emission layer 30 in contact with the hole transport layer 40 can be oriented. Specifically, the hole transport layer 40 can include a polyimide-based polymer. For example, the polyimide-based polymer is heat-crosslinked at a high temperature via an imidization reaction, and then is subjected to a rubbing process in a predetermined direction. Thus, one face of the hole transport layer 40 can be oriented.

The organic light-emitting device 100 can include, in addition to the light-emission layer 30 and the hole transport layer 40, a hole injection layer HIL, an electron transport layer ETL, an electron injection layer EIL and a combination thereof. Known functional layers can be further included in the organic light-emitting device 100 as appropriate as needed.

For example, in FIG. 1, the organic light-emission device 100 includes an electron transport layer 50 between the light-emission layer 30 and the second electrode 20.

The hole injection layer HIL can facilitate the injection of holes. The hole injection layer can be made of at least one selected from a group of consisting of, for example, CuPc (cupper phthalocyanine), PEDOT (poly(3,4)-ethylenedioxy-thiophene), PANI (polyaniline), NPD (N,N-dinaphthyl-N, N'-diphenyl benzidine) and combinations thereof. However, the present disclosure is not limited thereto.

The electron transport layer ETL receive electrons from the second electrode 20. The electron transport layer ETL can transfer the supplied electrons to the light-emission layer 30. The electron transport layer EML can serve to facilitate the transport of electrons. The electron transport layer EML contains an electron transport material. The electron transport material can be electrochemically stabilized by being anionic (i.e., by obtaining electrons). Alternatively, the electron transport material can produce the stable radical anion. Alternatively, the electron transport material can contain a heterocyclic ring to be easily anionized by heteroatoms. In one example, the electron transport material can include at least one selected from a group of consisting of, for example, Alq3 (tris(8-hydroxyquinolino)aluminum), Liq (8-hydroxy-quinolinolatolithium), PBD (2-(4-biphenylyl)-5-(4-tert-butylphenyl)-1,3,4oxadiazole), TAZ (3-(4-biphenyl)4-phenyl-5-tert-butylphenyl-1,2,4-triazole), spiro-PBD, BAlq (bis(2-methyl-8-quinolinolate)-4-(phenylphenolato) aluminium), SAlq, TPBi (2,2',2-(1,3,5-benzinetriyl)-tris(1-phenyl-1-H-benzimidazole), oxadiazole, triazole, phenanthroline, benzoxazole and benzthiazole. However, the present disclosure is not limited thereto.

The electron injection layer EIL serves to facilitate the injection of electrons and contains an electron injection material. The electron injection material can include, but is not limited to, at least one selected from a group of consisting of Alq3 (tris(8-hydroxyquinolino)aluminum), PBD, TAZ, spiro-PBD, BAlq, SAlq and combinations thereof. Alternatively, the electron injection layer EIL can be made of a metal compound. The metal compound can include, but is not limited to, at least one selected from a group of consisting of, for example, LiQ, LiF, NaF, KF, RbF, CsF, FrF, BeF2, MgF2, CaF2, SrF2, BaF2 and RaF2.

In one implementation of the present disclosure, the organic light-emitting device further includes an anti-reflective film 80. The anti-reflective film 80 is embodied as a circular polarizer.

Figure 3:
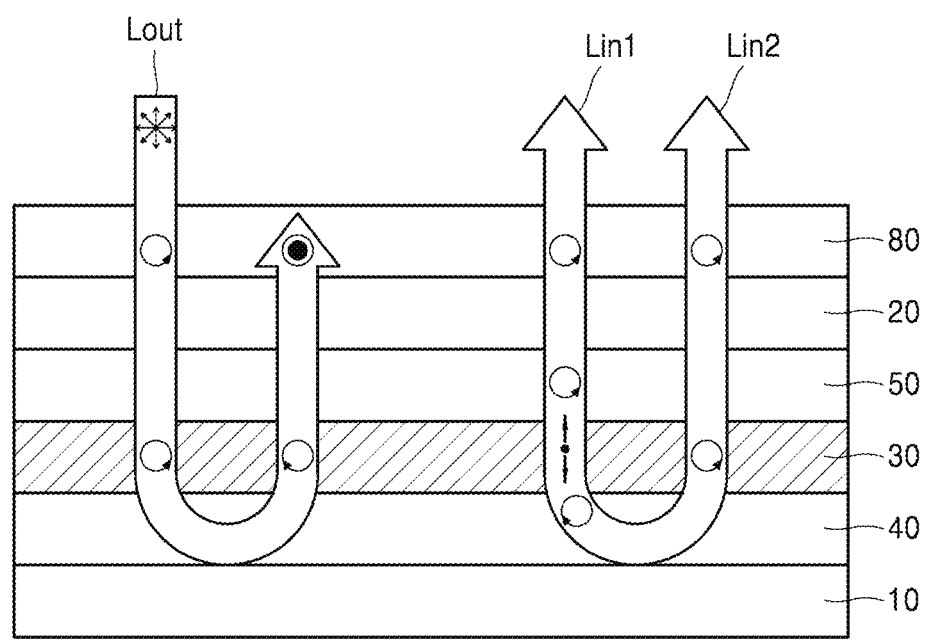
FIG. 3 is a schematic cross-sectional view of an organic light-emission device according to an example embodiment of the present disclosure.

Referring to FIG. 3, an organic light-emission device 200 according to an example embodiment of the present disclosure can include the anti-reflective film 80 on an outer face of the first electrode 10 or on an outer face of the second electrode 20.

The anti-reflective film 80 can block external light Lout so that the external light Lout is reflected inside the organic light-emission device 200 and is not transmitted to the viewer.

Referring to FIG. 3, the external light Lout is in a non-polarized state before entering the organic light-emission device 200. When the external light Lout has passed through the anti-reflective film 80, the anti-reflective film 80 can allow passing therethrough of only light of the circular polarization direction corresponding to the circular polarization direction of the anti-reflective film 80. For example, when the circular polarization direction of the anti-reflective film 80 is a right-handed circular polarization direction, the external light Lout passing through the anti-reflective film 80 is right-handed circularly polarized. To the contrary, when the circular polarization direction of the anti-reflective film 80 is a left-handed circular polarization direction, the external light Lout passing through the anti-reflective film 80 is left-handed circularly polarized. In FIG. 3, in one example, the circular polarization direction of the anti-reflective film 80 has a left-handed circular polarization direction. The external light Lout passing through the anti-reflective film 80 has the left-handed circularly polarized state. The left-handed circularly polarized external light Lout proceeds in a direction toward the first electrode 10 and then be reflected by the first electrode 10. Thus, a progression direction thereof can be directed back to the anti-reflective film 80. Thus, the circular polarization direction of the external light Lout to have the right-handed circular polarization direction. Then, the external light Lout with the right-handed circular polarization direction proceeds to the anti-reflective film 80, but does not pass through the anti-reflective film 80. In accordance with this principle, the external light Lout enters the interior of the organic light-emission device 200 and is blocked by the anti-reflective film 80 to prevent the viewer from viewing the reflected external light Lout.

In one example, internal light generated in the light-emission layer 30 can include first light Lin1 towards the second electrode 20 and second light Lin2 towards the first electrode 10. As described above, internal light generated in the light-emission layer 30 has a circularly polarized state. The light emitted from the light-emitting layer 30 has the same circular polarization direction as that of the anti-reflective film 80. In one example, when the circular polarization direction of the anti-reflective film 80 is a left-handed circular polarization direction, the first light Lin1 has a left-handed circular polarization direction. The second light Lin2 has a right-handed circular polarization direction because a traveling direction of the second light Lin2 is opposite to that of the first light Lint.

Since the first light Lin1 has the same left-handed circular polarization direction as the circular polarization direction of the anti-reflective film 80, the first light Lin1 can pass through the anti-reflective film 80 to the viewer.

The second light Lin2 has the right-handed circular polarization direction and proceeds in the direction toward the first electrode 10. Then, the second light Lin2 can be reflected by the first electrode 10 and the progression direction thereof can be directed back to the anti-reflective film 80. Thus, the second light Lin2, whose moving direction changes toward the anti-reflective film 80 has a left-handed circular polarization direction. Since the second light Lin2 having the left-handed circular polarization direction is identical to the circular polarization direction of the anti-reflective film 80, the second light Lin2 can pass through the anti-reflective film 80 to the viewer.

Thus, the organic light-emitting device 200 is configured such that both of the first light Lin1 and the second light Lin2 generated from the light-emission layer 30 pass through the anti-reflective film 80. Thus, the light transmittance of the device 200 is improved, and as a result, the light efficiency thereof is improved.

In one implementation of the present disclosure, there is proposed an organic light-emission device comprising: a first electrode, a second electrode, and the light-emission layer interposed therebetween, wherein the light-emission layer contains a mesogenic polymer-based light-emission material and a chiral dopant, wherein the light-emission layer has one face facing the first electrode and an opposite face facing the second electrode, wherein molecules of the mesogenic polymer-based light-emission material in the one face are orientated in a first predetermined direction, while molecules of the mesogenic polymer-based light-emission material in the opposite face are orientated in a second predetermined direction different from the first predetermined direction, wherein molecules of the mesogenic polymer-based light-emission material are vertically arranged in a twisted manner based on a difference between the first and second predetermined directions, thereby to form a twisted structure, wherein an angle of the second predetermined direction relative to the first predetermined direction is defined as a twisted angle, wherein the twisted angle is in a range of 60° to 100°.

In one implementation of the present disclosure, there is proposed a method for manufacturing an organic light-emission device, the method comprising: providing a first electrode; forming a hole transport layer on the first electrode; applying orientation into a top face of the hole transport layer to form an orientation-formed film of the hole transport layer; applying and drying a solution on the orientation-formed film to form a provisional light-emission layer on the hole transport layer, wherein the solution contains a mesogenic polymer-based light-emission material and a chiral dopant; applying orientation into a top face of the provisional light-emission layer to have an orientation different from the orientation of the orientation-formed film of the hole transport layer; coating a photocurable polymer on the oriented top face of the provisional light-emission layer to form a coated layer and then photo-curing the coated layer; heating the provisional light-emission layer to form a light-emission layer having a twisted structure; removing the coated layer; and forming a second electrode over the light-emission layer.

Figure 4:
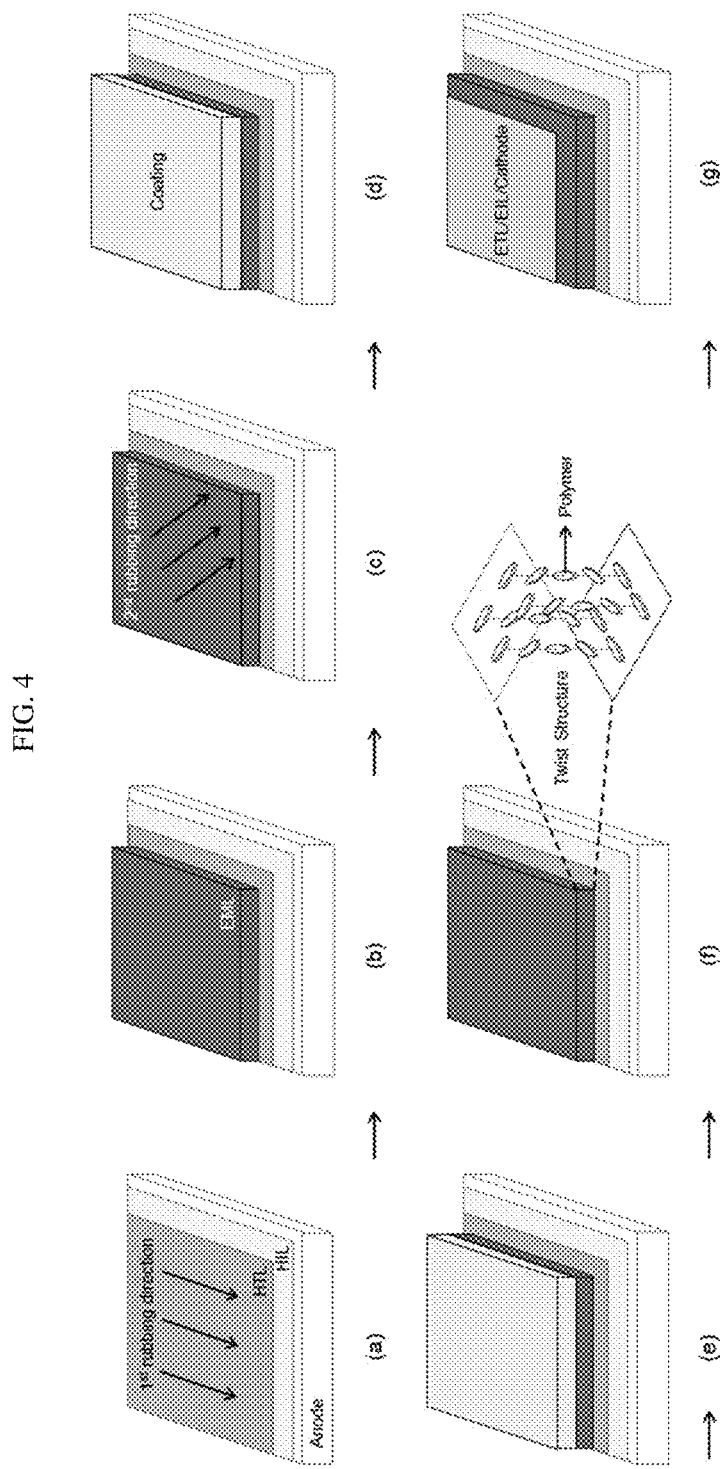
FIG. 4 is a schematic illustration of a method for manufacturing an organic light-emission device according to an example embodiment of the present disclosure.

FIG. 4 is a schematic illustration of a method for manufacturing the organic light-emission device.

In (a) in FIG. 4, a thin film made of a hole injection layer (HIL) material is formed on a cleaned patterned ITO glass (first electrode, anode). Next, a polyimide-based polymer as a hole transport layer (HTL) material is formed into a thin film having a thickness of 15 nm and is dried and heated to heat-crosslink the film via imidization reaction. Then, a top face of the film is (first) rubbed by rubbing means to form an orientation-formed film.

In (b) in FIG. 4, a mesogenic polymer-based light-emission material (F8BT) is coated on a top face of the orientation-formed film.

In (c) in FIG. 4, a top face of the coated layer of the mesogenic polymer-based light-emission material (F8BT) is (second) rubbed using rubbing means to orient the top face. The second rubbing direction is different from the first rubbing direction.

In (d) in FIG. 4, a photo-curable polymer is coated on the thus oriented top face of the coated layer of the mesogenic polymer-based light-emission material F8BT and is fixed by photo-curing.

In (e) in FIG. 4, a meso-phase is induced by heating the mesogenic polymer-based light-emission material (F8BT) to a temperature above a glass transition temperature of the mesogenic polymer-based light-emission material (F8BT), thereby twisting a molecular arrangement of the mesogenic polymer-based light-emission material (F8BT) to form a twisted structure. Thus, the light-emission layer is formed.

In (f) in FIG. 4, the photo-curable polymer is removed. In the light-emission layer, the mesogenic polymer-based light-emission material polymer has a twisted structure.

In (g) in FIG. 4, an electron transport layer (ETL) and LiF/Al (second electrode, cathode) are stacked in this order on the light-emission layer to fabricate an organic light-emission device.

Figure 5:
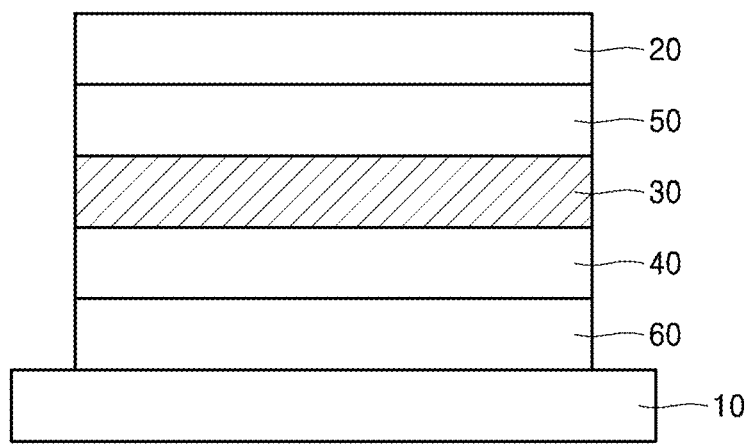
FIG. 5 is a schematic cross-sectional view of an organic light-emission device obtained by a method of manufacturing an organic light-emission device according to an example embodiment of the present disclosure.

FIG. 5 is a schematic cross-sectional view of an organic light-emission device 300 obtained by the method of FIG. 4. In FIG. 5, a first electrode 10, a hole injection layer 60, a hole transport layer 40, a light-emission layer 30, an electron transport layer 50 and a second electrode 20 are sequentially stacked in this order. The light-emission layer 30 has a twisted structure. A detailed description of the light-emission layer 30 is as described above.

Figure 6:
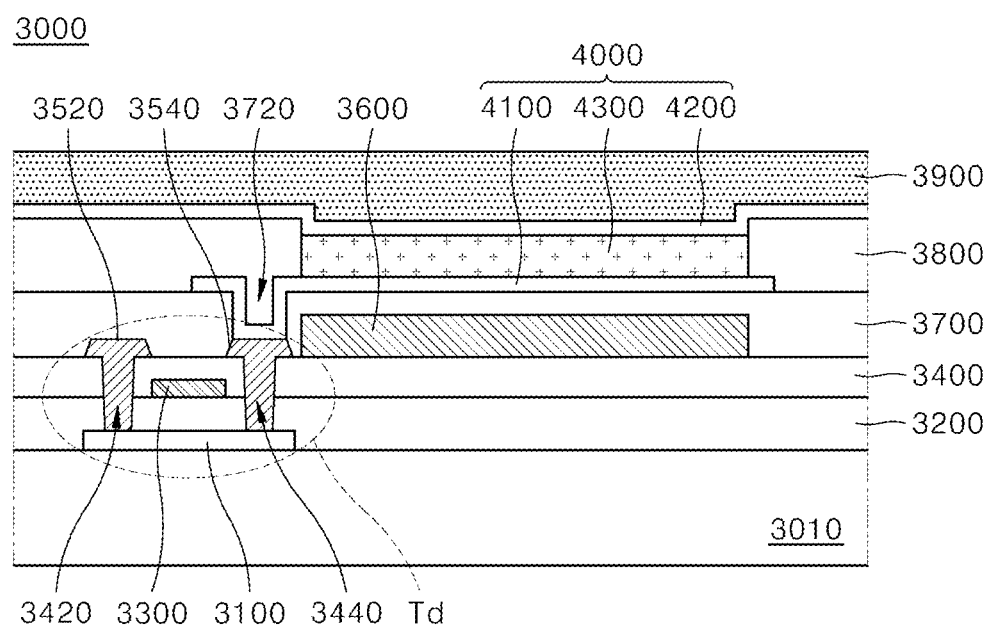
FIG. 6 is a schematic cross-sectional view of an organic light-emission display device using an organic light-emission device according to one embodiment of the present disclosure.

FIG. 6 is a schematic cross-sectional view of an organic light-emission display device 3000 including an organic light-emission device according to one embodiment of the present disclosure.

As shown in FIG. 6, an organic light-emission display device 3000 can include a substrate 3010, an organic light-emission device 4000, and an encapsulation film 3900 covering the organic light-emission device 4000. A driving thin-film transistor TFT, which is a driving device, and the organic light-emission device 4000, which is connected to the driving thin-film transistor TFT, are positioned on the substrate 3010.

A gate line and a data line, which define a pixel region, a power line extending parallel to and spaced from either the gate line or the data line, a switching thin-film transistor connected to the gate line and data line, a storage capacitor connected to the power line and one electrode of the switching thin-film transistor are formed on the substrate 3010.

The driving thin-film transistor Td is connected to the switching thin-film transistor, and includes a semiconductor layer 3100, a gate electrode 3300, a source electrode 3520 and a drain electrode 3540.

The semiconductor layer 3100 is formed on the substrate 3010, and is made of an oxide semiconductor material or polycrystalline silicon. When the semiconductor layer 3100 is made of an oxide semiconductor material, a light-blocking pattern can be formed below the semiconductor layer 3100. The light-blocking pattern prevents light from being incident on the semiconductor layer 3100, thereby preventing the semiconductor layer 3010 from being deteriorated by light. Alternatively, when the semiconductor layer 3100 can be made of polycrystalline silicon, impurities can be doped into both edges of the semiconductor layer 3100.

On the semiconductor layer 3100, a gate insulating film 3200 made of an insulating material is formed over the entire face of the substrate 3010. The gate insulating film 3200 can be made of an inorganic insulating material such as silicon oxide or silicon nitride.

A gate electrode 3300 made of a conductive material such as metal is formed on the gate insulating film 3290, and in a region corresponding to a middle region of the semiconductor layer 3100. The gate electrode 3300 is connected to the switching thin-film transistor.

An interlayer insulating film 3400 made of an insulating material is formed on the gate electrode 3300 and over the entire face of the substrate 3010. The interlayer insulating film 3400 can be made of an inorganic insulating material such as silicon oxide or silicon nitride, or can be made of an organic insulating material such as benzocyclobutene or photo-acryl.

The inter-layer insulating film 3400 has first and second contact holes 3420 and 3440 defined therein for respectively exposing both lateral portions of the semiconductor layer 3100. The first and second contact holes 3420 and 3440 are spaced apart from the gate electrode 330 and disposed on both sides of the gate electrode 3300 respectively.

On the inter-layer insulating film 3400, the source electrode 3520 and drain electrode 3540 made of a conductive material such as a metal are disposed. The source electrode 3520 and drain electrode 3540 are disposed around the gate electrode 3300 and are spaced from each other. The source electrode 3520 and drain electrode 3540 contact both sides of the semiconductor layer 3100 via the first and second contact holes 3420 and 3440, respectively. The source electrode 3520 is connected to a power line.

The semiconductor layer 3100, the gate electrode 3300, the source electrode 3520, and the drain electrode 3540 define the driving thin-film transistor Td. The driving thin-film transistor Td has a coplanar structure in which the gate electrode 3300, the source electrode 3520, and the drain electrode 3540 are disposed in a coplanar manner on the semiconductor layer 3100.

Alternatively, the driving thin-film transistor Td can have an inverted staggered structure in which the gate electrode is located below the semiconductor layer, and the source electrode and the drain electrode are located above the semiconductor layer. In this case, the semiconductor layer can be made of amorphous silicon. In one example, the switching thin-film transistor can have substantially the same structure as the driving thin-film transistor Td.

In one example, the organic light emission display device 3000 can include a color filter 3600 that absorbs light generated from the organic electroluminescent device 4000. For example, the color filter 3600 can absorb red (R), green (G), blue (B), and white (W) light. In this case, color filter patterns that absorb the red, green and blue light can be disposed separately on a pixel basis. Each of these color filter patterns can overlap with a corresponding organic light-emitting layer 4300 of the organic electroluminescent device 4000 that emits light having a corresponding wavelength. Adopting the color filter 3600 can allow the organic light emission display device 3000 to render a full color range.

For example, when the organic light emission display device 3000 is of a bottom light emission type, the color filter 3600, which absorbs light, can be located above the inter-layer insulating film 3400 in a region of the organic electroluminescent device 4000. In an alternative embodiment, when the organic light emission display device 3000 is of a top light emission type, the color filter can be located on top of the organic electroluminescent device 4000, i.e., on top of the second electrode 4200. In one example, the color filter 3600 can have a thickness of 2 to 5 μm. In this connection, the organic electroluminescent device 4000 can be embodied as a white-light organic electroluminescent device having a tandem structure as shown in FIG. 1 to FIG. 6.

In one example, a protective layer 3700 having a drain contact hole 3720 exposing the drain electrode 3540 of the driving thin-film transistor Td can be formed to cover the driving thin-film transistor Td.

On the protective layer 3700, the first electrode 4100 connected to the drain electrode 3540 of the driving thin-film transistor Td via the drain contact hole 3720 can be formed on a pixel region basis.

The first electrode 4100 can act as an anode and can be made of a conductive material having a relatively higher work function value. For example, the first electrode 4100 can be made of a transparent conductive material such as ITO, IZO or ZnO.

In one example, when the organic light emitting display device 3000 is of a top light emission type, a reflective electrode or a reflective layer can be further formed below the first electrode 4100. For example, the reflective electrode or reflective layer can be made of any one of aluminum (Al), silver (Ag), nickel (Ni), and aluminum-palladium-copper (APC alloy).

The organic light-emission display device 3000 is of a bottom emission type in which light emitted from the light-emission layer 4300 passes through the first electrode 4100 and is output out of the device 3000. Alternatively, the organic light-emission display device 3000 is of a top emission type in which light emitted from the light-emission layer 4300 passes through the second electrode 4200 and is output out of the device 3000. When the device 3000 is of the bottom light-emission type, an anti-reflective film as the circular polarizer is disposed below the first electrode 4100. When the device 3000 is of the top light-emission type, an anti-reflective film as the circular polarizer is disposed on a top face of the second electrode 4200.

On the protective layer 3700, a bank layer 3800 covering an edge of the first electrode 4100 is formed. The bank layer 3800 exposes a center region of the first electrode 4100 corresponding to the pixel region.

A second electrode 4200 is formed on the organic light-emitting layer 4300. The second electrode 4200 can be disposed over an entire display region and can be made of a conductive material having a relatively lower work function value and can act as a cathode. For example, the second electrode 4200 can be made of any one of aluminum (Al), magnesium (Mg), and aluminum-magnesium alloy (AlMg).

The first electrode 4100, the organic light-emitting layer 4300 and the second electrode 4200 together define the organic electroluminescent device 4000.

On the second electrode 4200, the encapsulation film 3900 is formed to prevent external moisture from penetrating into the organic electroluminescent device 4000. The encapsulation film 3900 can have a triple layer structure in which a first inorganic layer and an organic layer and a second inorganic layer are sequentially stacked. However, the present invention is not limited thereto.

Hereinafter, Examples and Comparative examples of the present disclosure will be described. Such Examples are merely examples of the present disclosure, and the present disclosure is not limited to the Examples.

EXAMPLES

<Fabrication of Organic Light-Emission Device>

CuPc as a hole injection layer (HIL) material was vacuum-deposited to a thickness of 2 nm on a cleaned patterned ITO glass. Then, 15 nm thickness of AL22636 as a hole transport layer (HTL) material was coated on the hole injection layer (HIL). In this connection, the hole transport layer acts as an orientation-formed layer. Then, a solvent was dried at 100° C. for 10 minutes. After heating the hole transport layer at 210 degrees C. for 60 minutes to heat-crosslink the hole transport layer via imidization reaction, a first rubbing process was performed using rubbing means to form an orientation-formed film having a first rubbing direction. The orientation-formed film can correspond to the top face of the hole transport layer.

Then, as materials of the light emission layer (EML), F8BT (4 wt % in toluene) having a following structural formula as a mesogenic polymer-based light-emission material, and a chiral dopant having a following structural formula were mixed in toluene. The mixture was coated on the top face of the hole transport layer and was dried to form a provisional light-emission layer. A content of the chiral dopant was 3 wt % relative to a weight of the provisional light-emission layer based on a solid-state content.

A second rubbing process was applied into a top face of the provisional light-emission layer to form an anisotropic morphology having a second rubbing direction.

Then, an UV curable polymer (NOA 65, Norland) was coated and UV-cured on the top face of the provisional light-emission layer, thereby fixing the orientation of the top face of the provisional light-emission layer.

Then, the provisional light-emission layer was heated to 150° C. to induce a meso-phase, and then the NOA 65 was removed. At the meso-phase, a light-emission layer having a twisted structure was formed. The twisted structure was achieved by uniformly twisting the molecular arrangement of the F8BT between the top and bottom faces of the provisional light-emission layer via the azimuthal anchoring energy generated in the first rubbing direction in the bottom face and the azimuthal anchoring energy generated in the second rubbing direction in the top face.

Then, an organic light-emission device was fabricated by sequentially depositing TPBi as an electron transport layer (ETL) material on the top face of the light-emitting layer to a 20 nm thickness and then depositing LiF (1 nm) on the ETL layer and then depositing Al (70 nm) on the LiF layer.

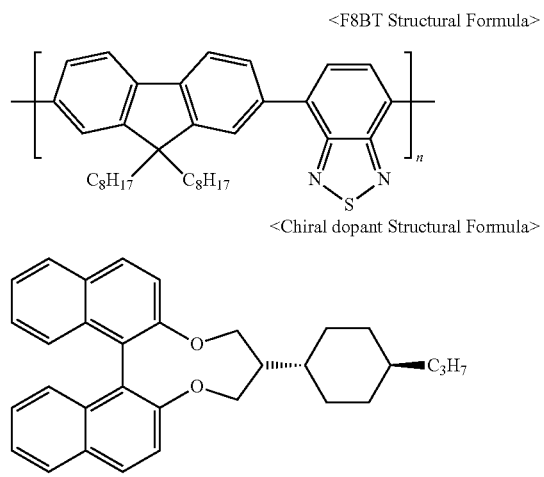

<F8BT Structural Formula>

<Chiral dopant Structural Formula>

Examples 1 to 2

In Examples 1 to 2, an angle of the second rubbing direction relative to the first rubbing direction was set to 80° and 100°, respectively.

Comparative Examples 1 to 4

In Comparative Examples 1 to 4, an angle of the second rubbing direction relative to the first rubbing direction was set to 0°, 20°, 40° and 60° respectively.

Comparative Example 5

In the preparation of the organic light-emitting device, the UV curable polymer (NOA 65, Norland) was not coated and cured on the top face of the provisional light-emission layer having the orientation defined therein via the second rubbing process. Thus, the orientation of the top face of the provisional light-emission layer was not fixed. Then, an organic light-emission device was fabricated by forming an electron transport layer on the light-emission layer. In this Comparative Example 5, an angle of the second rubbing direction relative to the first rubbing direction was set to be 80°.

Experimental Example 1

The devices of Examples 1 to 2 and Comparative Examples 1 to 4 were evaluated in terms of PL spectra and EL spectra using spectrometry. Table 1 shows the twisted angles θT obtained from the PL spectral evaluation results.

The twisted angles were measured using measuring means with a structure shown in FIG. 12 according to a method described in the paper "Control of Circularly Polarized Electroluminescence in Induced Twist Structure of Conjugate Polymer, Jae-Hoon Kim, et al., Adv. Mater. 2017, 1700907". In this connection, the laser conditions were 5.0 mW and 633 nm wavelength.

TABLE 1

| Examples | Twisted angle $\theta_T$ |
| --- | --- |
| Example 1 | 82° |
| Example 2 | 100° |
| Comparative Example 1 | 0° |
| Comparative Example 2 | 20° |
| Comparative Example 3 | 33° |
| Comparative Example 4 | 52° |
| Comparative Example 5 | 56° |

Figure 7:
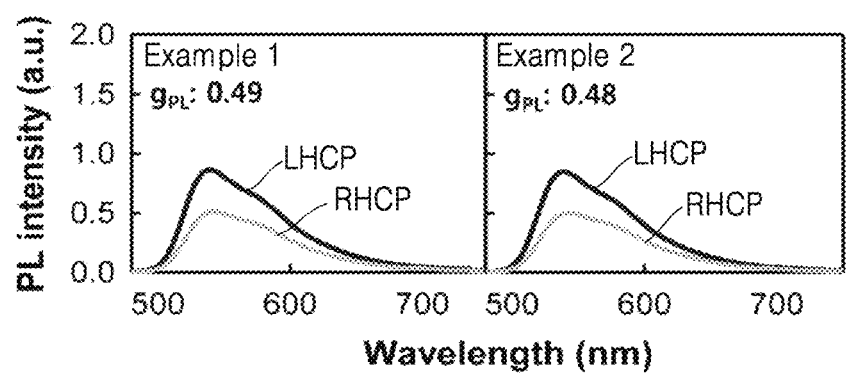
FIG. 7 to FIG. 10 show optical analysis spectra of devices in accordance with Examples and Comparative Examples.

FIG. 7 shows the PL spectra of Examples 1 to 2.

Figure 8:
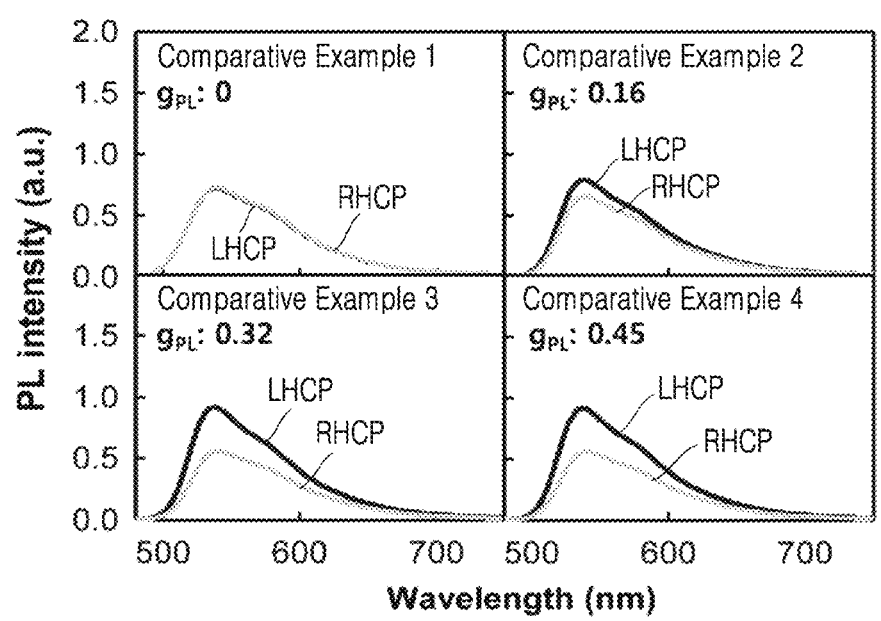

FIG. 8 shows the PL spectra of Comparative Examples 1 to 4.

Figure 9:
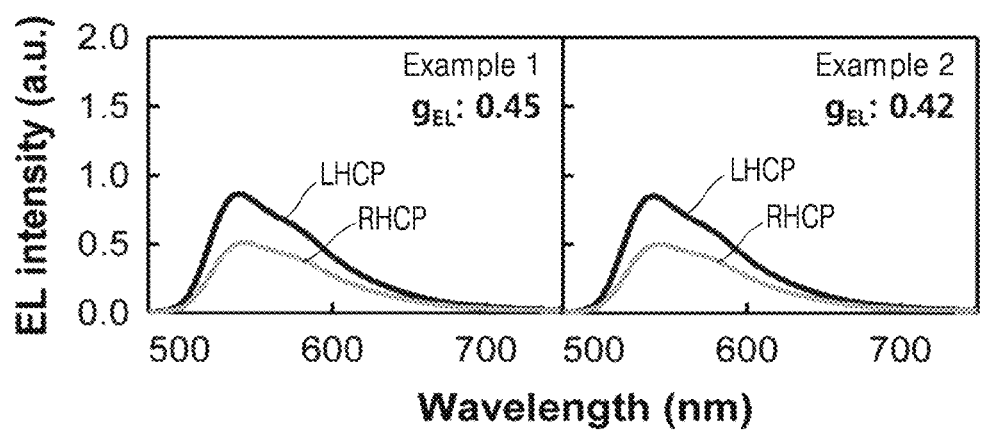

FIG. 9 shows the EL spectra of Examples 1 to 2.

Figure 10:
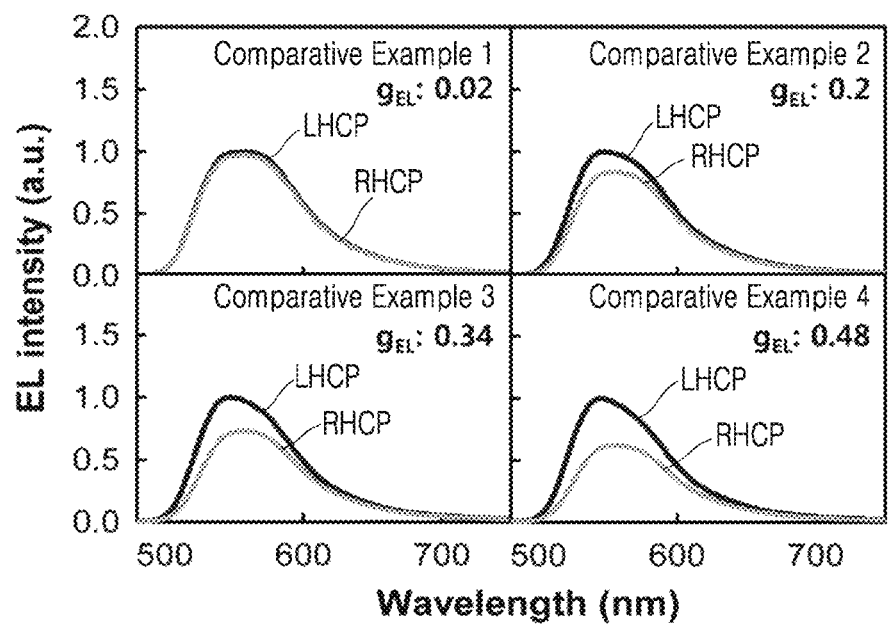

FIG. 10 shows the EL spectra of Comparative Examples 1 to 4.

From the results in Table 1, it can be seen that each of the devices of Examples 1 to 2 has a light-emission layer having a twisted structure with a larger twisted angle. From FIG. 7 to FIG. 10, it can be seen that in the devices of Examples 1 to 2, a degree by which the left-handed circular polarization LHCP is dominant relative to the right-handed circular polarization RHCP is larger than a degree by which the left-handed circular polarization LHCP is dominant relative to the right-handed circular polarization RHCP is larger in Comparative Examples 1 to 4.

Experimental Example 2

To evaluate surface characteristics of the light-emission layers fabricated in Example 1 and Comparative Example 5, texture images thereof were obtained by AFM (Atomic Force Microscopy) analysis.

Figure 11:
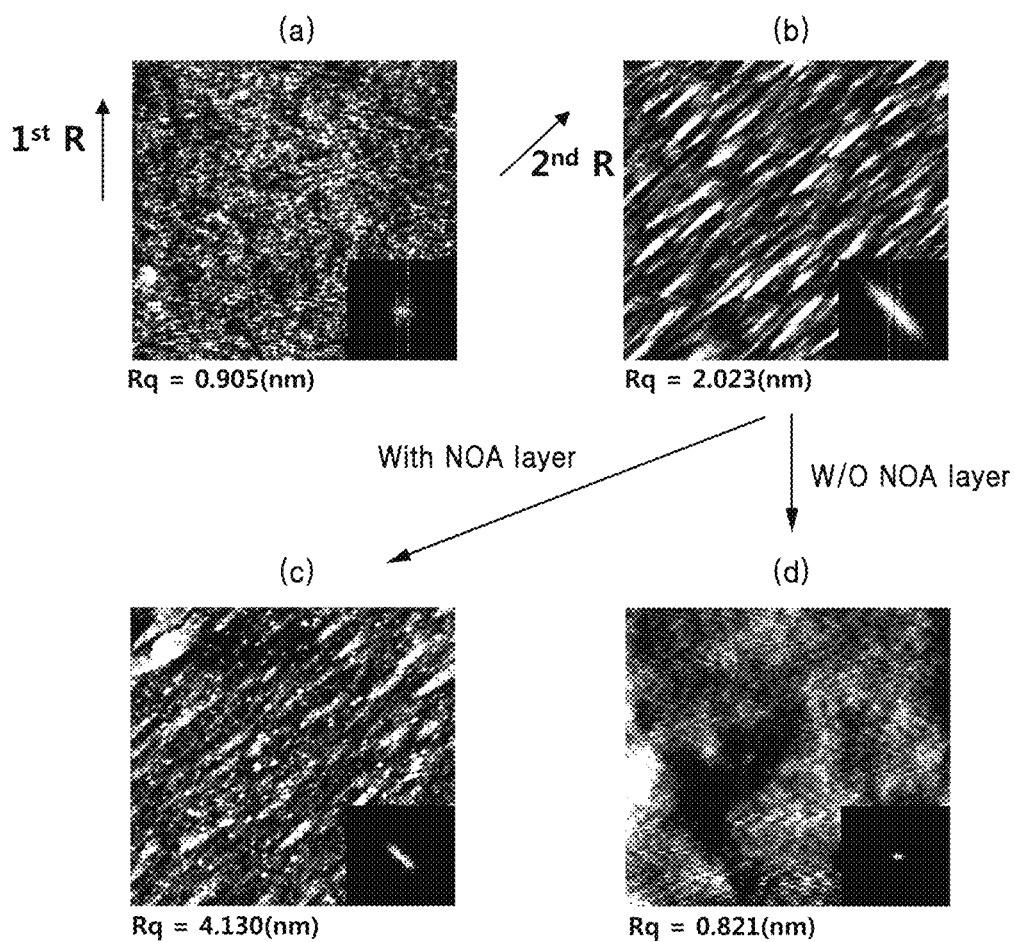
FIG. 11 shows AFM textures obtained from top surfaces of light-emission layers fabricated in accordance with Examples and Comparative Examples.

FIG. 11 shows AFM textures obtained from the top face of the light-emission layer before and after the second rubbing of the provisional light-emission layer and from the top face of the light-emission layer after forming the twisted structure via heating, during the manufacturing process of the light-emission layers fabricated in Example 1 and Comparative Example 5.

(a) in FIG. 11 shows the AFM texture of the top face of the provisional light-emission layer of Comparative Example 5 before the second rubbing.

(b) in FIG. 11 shows the AFM texture of the top face of the provisional light-emission layer of Comparative Example 5 after the second rubbing. An anisotropic morphology is formed according to the second rubbing direction.

(c) in FIG. 11 shows the AFM texture of the top face of the light-emission layer after the formation of the twisted structure via heating in Example 1. This confirms that the anisotropic morphology of the top surface is well maintained because the anisotropic morphology formed according to the second rubbing direction is fixed by the UV curable polymer (NOA 65, Norland). Thus, it can be seen that the twisted angle of the thus formed light-emission layer is formed in a proportional manner to the difference between the first rubbing direction and the second rubbing direction.

(d) in FIG. 11*d* shows the AFM texture of the top face of the light-emission layer after twisted structure formation by heating in Comparative Example 5. The anisotropic morphology formed according to the second rubbing direction is not fixed by the UV curable polymer (NOA 65, Norland). Thus, the surface morphology has collapsed. Since the Comparative Example 5 could not maintain the second orientation of the top face of the light-emission layer, the twisted angle was not achieved in a proportional manner to the difference between the first rubbing direction and the second rubbing direction.

Experimental Example 3

The transmitted textures of the light-emission layer samples as prepared in Examples 1 to 2 were evaluated using the experimental instrument set as shown in FIG. 12.

Figure 13:
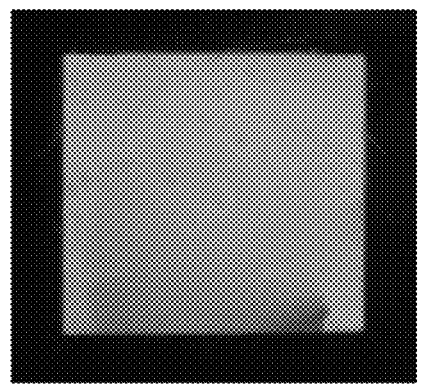
FIG. 13 shows light-transmitted texture images of light-emission layer samples fabricated in accordance with Examples.
Figure 13:
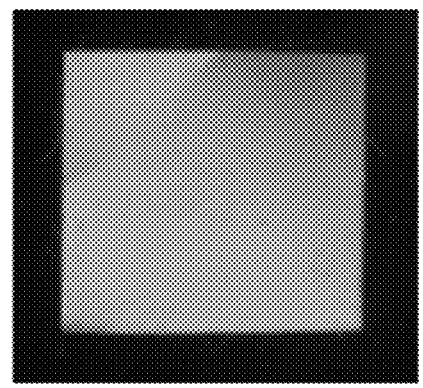

FIG. 13 shows the transmitted textures obtained for the light-emission layer samples fabricated in Examples 1 to 2.

(a) in FIG. 13 shows the transmitted texture obtained for the light-emission layer sample of Example 1. (b) in FIG. 13 shows the transmitted texture obtained for the light-emission layer sample of Example 2. The circular polarization direction of the twisted structure of the light-emission layer is checked using the measuring means having the left-handed circular polarizer in FIG. 12. When light passes through the left-handed circular polarizer and is left-handed circularly polarized, the light can pass through the light-emission layer with a twisted structure of the left-handed circular polarization direction. Thus, the light transmission increases. To the contrary, when light passes through the left-handed circular polarizer and is left-handed circularly polarized, the light need not pass through the light-emission layer with a twisted structure of the right-handed circular polarization direction. Thus, the light transmission decreases.

From (a) in FIG. 13 and (b) in FIG. 13, it can be seen that the left-handed twisted structure is uniformly well formed in all regions. That is, it can be confirmed that, in each of the light-emission layers in Example 1 and Example 2, a twisted structure is uniformly formed in which the left-handed circular polarization is predominant relative to the right-handed circular polarization.

As described above, the present disclosure is described with reference to the drawings. However, the present disclosure is not limited by the embodiments and drawings disclosed in the present specification. It will be apparent that various modifications can be made thereto by those skilled in the art within the scope of the present disclosure. Furthermore, although the effect resulting from the features of the present disclosure has not been explicitly described in the description of the embodiments of the present disclosure, it is obvious that a predictable effect resulting from the features of the present disclosure should be recognized.

What is claimed is:

1. An organic light-emission display device comprising:
   a substrate;
   a driving thin-film transistor (TFT) on the substrate;
   an organic light-emission device connected to the driving thin-film transistor TFT; and
   an encapsulation film covering the organic light-emission device,
   wherein the organic light-emission display device is of a top emission type,
   wherein the organic light-emission device includes a first electrode; a second electrode; a light-emission layer interposed between the first and second electrodes; a hole transport layer contacting one face of the light-emission layer, an electron transport layer located between the light-emission layer and the second electrode; and an anti-reflective film on an outer face of the second electrode,
   wherein the light-emission layer contains a mesogenic polymer-based light-emission material and a chiral dopant, wherein the light-emission layer has the one face facing the first electrode and an opposite face facing the second electrode, wherein molecules of the mesogenic polymer-based light-emission material in the one face are orientated in a first predetermined direction, while molecules of the mesogenic polymer-based light-emission material in the opposite face are orientated in a second predetermined direction different from the first predetermined direction, wherein an angle of the second predetermined direction relative to the first predetermined direction is defined as a twisted angle, wherein molecules of the mesogenic polymer-based light-emission material are vertically arranged in a spirally twisted manner within the twisted angle between the one and opposite faces of the light-emission layer to form a twisted structure, wherein the twisted angle of the light-emission layer is greater than a saturated twisted angle of the mesogenic polymer-based light-emission material, wherein the anti-reflective film includes a circular polarizer, wherein a circular polarization direction of the anti-reflective film is a left-handed circular polarization direction, wherein the hole transport layer has an interface contacting the light-emission layer, wherein the interface has an orientation based on rubbing or optical orientation, and wherein the twisted angle of the light-emission layer is in a range of from 82° to 100°.

2. The organic light-emission display device of claim 1, wherein the light-emission layer contains the chiral dopant in a range from 0.1 to 30 wt %.

3. The organic light-emission display device of claim 1, wherein the hole transport layer contains a polyimide-based polymer.

4. The organic light-emission display device of claim 1, wherein light emitted from the light-emission layer has a right-handed circular polarization or a left-handed circular polarization.

5. The organic light-emission display device of claim 1, wherein an absolute value of a g-factor of light emitted from the light-emission layer is in a range from 0.01 to 2.

6. The organic light-emission display device of claim 1, wherein the circular polarization direction of the anti-reflective film and a circular polarization direction of light emitted from the light-emission layer are the same.

7. The organic light-emission display device of claim 1, wherein molecules of the mesogenic polymer-based light-emission material between the one face and the opposite face are orientated in a third direction different from the first and second predetermined directions.

8. The organic light-emission display device of claim 4, wherein a third direction is different from the first and second predetermined directions, and intersects both the first and second predetermined directions.

9. The organic light-emission display device of claim 1, wherein the light-emission layer has the twisted structure at a meso-phase, wherein the twisted structure is achieved by uniformly twisting a molecular arrangement of the mesogenic polymer-based light-emission material between a top and bottom faces of a provisional light-emission layer via azimuthal anchoring energy generated in a first rubbing direction in the bottom face and the azimuthal anchoring energy generated in a second rubbing direction in the top face.

10. The organic light-emission display device of claim 9, wherein an angle of the second rubbing direction relative to the first rubbing direction is from 80° to 100°.

11. The organic light-emission display device of claim 1, further comprising a reflective layer, wherein the reflective layer is made of at least one of aluminum (Al), silver (Ag), nickel (Ni), and aluminum-palladium-copper.

12. The organic light-emission display device of claim 1, further comprising a color filter located on top of the organic light-emission device.

* * * * *